United States Patent [19]

Sinha et al.

[11] Patent Number: 5,384,008

[45] Date of Patent: Jan. 24, 1995

[54] PROCESS AND APPARATUS FOR FULL WAFER DEPOSITION

[75] Inventors: Ashok Sinha, Palo Alto; Sasson Somekh, Los Altos Hills, both of Calif.

[73] Assignee: Applied Materials, Inc., Santa Clara, Calif.

[21] Appl. No.: 79,481

[22] Filed: Jun. 18, 1993

[51] Int. Cl.[6] .......................................... H01L 21/00
[52] U.S. Cl. .................... 156/643; 156/662; 156/345; 118/728; 134/1
[58] Field of Search .................. 156/643, 345, 662; 118/728, 715, 723 ER, 723 ME, 723 MW, 723 E

[56] References Cited

U.S. PATENT DOCUMENTS

| | | | |
|---|---|---|---|
| 4,981,722 | 1/1991 | Möller et al. | 156/643 |
| 4,990,374 | 2/1991 | Keeley et al. | 118/715 |
| 5,133,284 | 7/1992 | Thomas et al. | 118/715 |
| 5,213,650 | 5/1993 | Wang et al. | 118/728 |

FOREIGN PATENT DOCUMENTS

| | | |
|---|---|---|
| 3-055831 | 3/1991 | Japan . |
| 5-175162 | 7/1993 | Japan . |

*Primary Examiner*—R. Bruce Breneman
*Assistant Examiner*—George Goudreau
*Attorney, Agent, or Firm*—John P. Taylor

[57] ABSTRACT

A process and apparatus is described for depositing a layer of material over the entire frontside surface of a semiconductor wafer without leaving residues on the backside of said wafer. A semiconductor wafer is placed on the surface of a first wafer support without contacting the frontside surface of the wafer to thereby permit access by deposition materials to the entire frontside surface of the wafer, and then a layer of material is deposited on the entire frontside surface of the semiconductor wafer. To remove any deposits formed on the backside of the wafer during such a deposition, the coated wafer is then placed generally coaxially on the surface of a generally circular second wafer support which will permit access to the outermost portions of the backside of the wafer. In one embodiment the second wafer support is provided with an annular groove coaxially formed in the surface of the second wafer support which faces the backside of the wafer. This annular groove has an outer diameter larger than the diameter of the wafer and an inner diameter smaller than the outer diameter of that portion of the backside of the wafer not containing deposits thereon from the deposition step, so that all of the backside surface containing such depositions is exposed by the groove. The wafer is then etched to remove from the backside any materials deposited thereon during the deposition step, by permitting etchant materials to contact such backside deposits through the annular groove formed in the second wafer support.

26 Claims, 3 Drawing Sheets

PROCESS AND APPARATUS FOR FULL WAFER DEPOSITION

BACKGROUND OF THE INVENTION

1. Field of the Invention

This invention relates to the formation of integrated circuit structures on semiconductor wafers. More particularly, this invention relates to a process and apparatus which results in deposition of material to the end edge of the wafer while providing for removal of deposition residues from the backside of the wafer.

2. Description of the Related Art

In the formation of integrated circuit structures on semiconductor wafers, it is important that materials not be deposited on the backside of the wafer, i.e., the rougher side of the wafer which is placed against the wafer support in a processing chamber. At least one reason for this is to avoid particle formation, which can occur if such materials deposited on the backside of the wafer later become dislodged, e.g., peel or flake off.

To avoid or inhibit such undesirable depositions on the backside of the wafer, various techniques and structures are sometimes employed such as, for example, a shadow ring which masks the peripheral portions of the top surface of the wafer to inhibit flow of the deposition gases and/or plasmas around the rounded or beveled end edge portion of the wafer to reach the back surface. Such a prior art structure is illustrated in FIG. 1, wherein a shadow ring 2, used to inhibit depositions on the end edge and backside of a wafer 10 on a wafer support 20 in a vacuum deposition chamber (not shown), also inhibits deposition over the entire front surface 12 of wafer 10.

While such techniques and structures are reasonably successful in inhibiting such backside depositions on the wafer, the penalty which must be paid is that integrated circuit structures constructed adjacent the end edge or periphery of the top surface of the wafer do not always receive the same deposition of materials as does the interior of the front surface of the wafer.

This interference with a complete deposition on the entire front surface of the wafer is also true when clamps are used to secure the wafer to a wafer support as shown in the prior art structure shown in FIG. 2, wherein clamps 22 secure wafer 10 to wafer support 20 in a vacuum deposition chamber (not shown) and thereby interfere with deposition on that portion of front surface 12 of wafer 10 lying beneath clamps 22.

In either instance, the failure to deposit material on the entire front surface of the wafer can result in a lowering of the yield of chips from a given diameter wafer. In other words, satisfactory integrated circuit structures cannot be formed in the area of the wafer immediately adjacent the end edge, so chips cut from such peripheral portions of the wafer will not have satisfactory integrated circuit structures formed thereon and must be discarded, thus lowering the overall yield of chips from the wafer.

Furthermore, simple geometries show that as the diameter of the wafer increases, more and more of the potential chips obtainable from a semiconductor wafer are located in the area of largest diameter of the wafer. As a result, the number of chips which may have to be discarded from a wafer due to insufficient processing adjacent the end edge of the wafer can become unacceptably high.

It would, therefore, be desirable to provide a process and apparatus wherein processing of the semiconductor wafer, such as a deposition process, can be carried out to the very edge of the front surface of a semiconductor wafer, i.e., even extending over the rounded or beveled edge of the wafer, while still inhibiting the generation of particles from undesirable backside depositions on the rear surface of the wafer.

SUMMARY OF THE INVENTION

It is, therefore, an object of the invention to provide a process and apparatus for depositing material over the entire frontside surface of the wafer which includes removal of any material deposited on the backside of the wafer during such a deposition.

The invention comprises securing a semiconductor wafer on the surface of a first wafer support without contacting the frontside surface of the wafer to thereby permit access by deposition materials to the entire frontside surface of the wafer, and then depositing a layer of material on the entire frontside surface of the semiconductor wafer. To remove any deposits formed on the backside of the wafer during such a deposition, the wafer is then placed generally coaxially against the surface of a generally circular second wafer support which is shaped to permit access to the outer portion of the backside of the wafer. The etchant gases can then reach this portion of the backside of the wafer to remove any unwanted deposits from the backside of the wafer. In one embodiment, access to the backside of the wafer is provided using a wafer support having an annular groove coaxially formed in its upper surface. This annular groove has an outer diameter larger than the diameter of the wafer and an inner diameter smaller than the outer diameter of that portion of the backside of the wafer not containing deposits thereon from the deposition step, so that all of the backside surface of the wafer containing such depositions is exposed by the groove. The wafer is then etched, resulting in the removal, from the backside of the wafer, of any materials deposited thereon during the deposition step, by permitting etchant materials to contact such backside deposits through the annular groove formed in the second wafer support.

When a layer of material such as tungsten or titanium nitride has been deposited for purposes of filling vias, contact openings, and/or trenches, the etch step used to remove the materials deposited on the backside of the wafer can also remove the materials deposited on the frontside of the wafer as well, leaving behind plugs formed in the contact window openings (contact openings, vias, and/or trenches) present on the integrated circuit structure being formed on the frontside of the wafer.

DETAILED DESCRIPTION OF THE INVENTION

Figure 1:
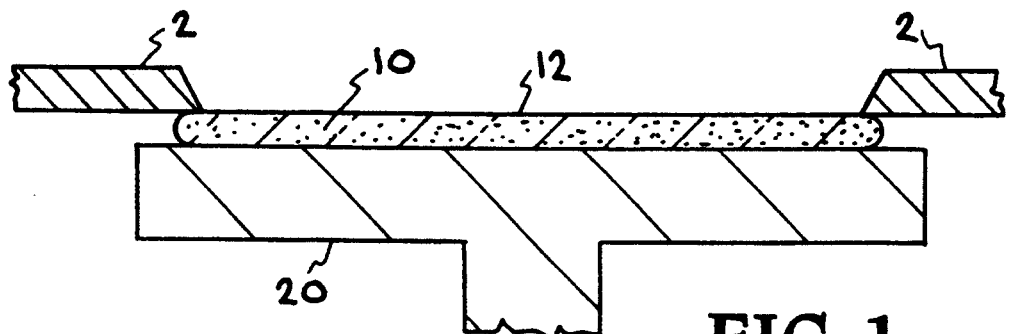
FIG. 1 is a vertical cross-sectional view of a prior art deposition apparatus wherein a shadow ring, used to inhibit deposition on the edge and backside of a wafer, also prevents full deposition on the entire upper surface of the wafer.
Figure 2:
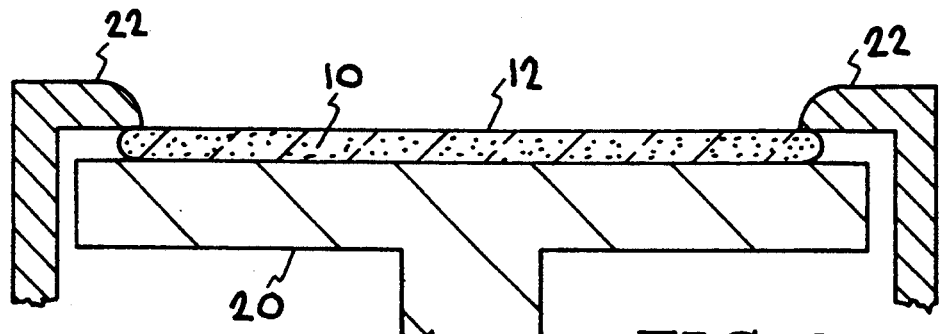
FIG. 2 is a vertical cross-sectional view of another prior art deposition apparatus wherein clamps are used to secure a wafer to a wafer support during deposition, which clamps prevent full deposition on the entire upper surface of the wafer.
Figure 3:
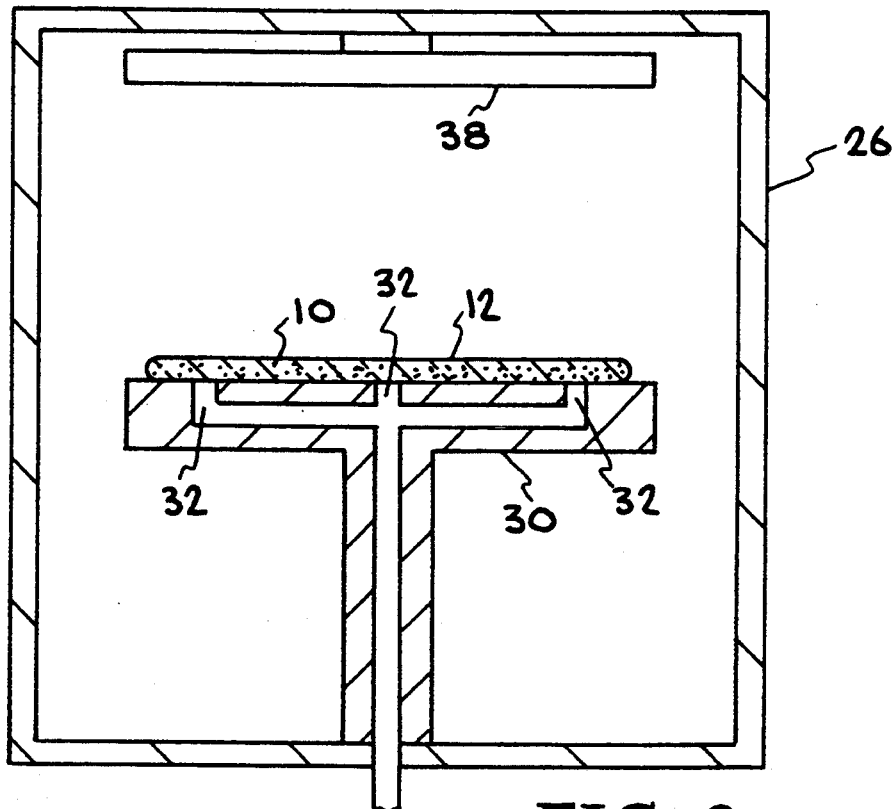
FIG. 3 is a vertical cross-sectional view of a wafer on a first wafer support which permits full deposition on the entire upper surface of the wafer.

Turning now to FIG. 3, the deposition step of the process is carried out in a conventional vacuum deposition chamber 26 having a first wafer support 30 to support wafer 10 and a second electrode 38 facing wafer 10. It will be noted that the entire frontside surface 12 of wafer 10 is exposed to the deposition, i.e., no shadow rings, clamping structures, etc. are utilized which would otherwise obscure or interfere with the deposition on the entire frontside surface 12 of wafer 10. In this manner, deposition on the entire surface 12 of wafer 10 can be carried out with inadvertent deposition on the backside of wafer 10, as well as on the rounded or beveled end edge of the wafer, later removed as will be described below.

The use of the term "frontside" herein is intended to describe the polished surface of semiconductor wafer 10 on which integrated circuit structures will be formed, as is well known to those skilled in the art; while the use of the term "backside" herein is intended to describe the opposite or unpolished surface of the semiconductor wafer, as is also well known to those skilled in the art.

Wafer 10 may be held on first wafer support 30 solely by gravity. Alternatively, wafer 10 may be secured to wafer support 30 by electrostatic clamping such as, for example, described in "Electrostatic Force and Absorption Current of Alumina Electrostatic Chuck", published by Watanabe et al. in Jpn. Journal of Applied Physics, Vol. 31 (1992) at pages 2145–2150. Wafer 10 may also be secured to first wafer support 30 by applying a vacuum to the backside of wafer 10 through bores 32 formed in wafer support 30 and which are appropriately connected to a vacuum source (not shown) which will provide a pressure lower than the pressure in vacuum deposition chamber 26.

Deposition on frontside surface 12 of wafer 10 is then carried out under conventional conditions dependent upon the type of layer to be formed on surface 12 of wafer 10. While any deposition process may now be carried out, in the practice of this invention, which is usually used in connection with the formation of integrated circuit structures on wafer 10, the invention provides particular utility with respect to deposition of a material or materials which will be later removed from the surface. Such depositions, for example, include the deposition of materials such as titanium, titanium nitride, aluminum, doped polysilicon, and/or tungsten which are deposited over the surface of an integrated circuit structure to fill vias, contact openings, and/or trenches previously formed in an insulation layer. In such instances, those portions of the deposition materials which are deposited on the surface of the insulation layer on the frontside of the wafer are sometimes later removed, leaving only those portions of the material remaining which were deposited in the respective vias, contact openings, and/or trenches.

Figure 3A:
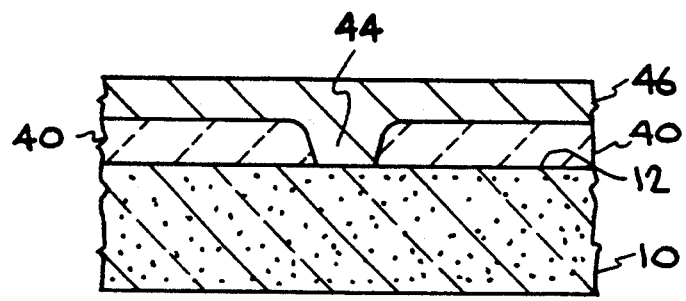
FIG. 3A is a fragmentary vertical side section view of a portion of the wafer and first wafer support structure of FIG. 3, but further provided with an insulation layer thereon, a contact opening in the insulation layer, and a layer of titanium nitride formed over the insulation layer and in the contact opening.

Therefore, by way of illustration, and not of limitation, the practice of the invention will hereinafter be described with respect to the deposition of a CVD layer 46 of titanium nitride on wafer 10 which, as shown in exaggerated form in FIG. 3A, will be deposited over the surface of a previously formed insulation layer 40 on surface 12 of wafer 10 and into contact opening 44 formed in insulation layer 40. It will be understood, that other layers of materials may also be deposited as well as the titanium nitride layer in order to optimize the filling of contact opening 44. However, such have been omitted for simplification of the illustration of the invention.

In accordance with the invention the deposition is carried out until a sufficient thickness of material such as, for example, titanium nitride has been deposited on wafer 10. In the case of a titanium nitride deposit which includes the filling of contact opening 44, the deposition may be carried out, for example, under CVD conditions by flowing from 1 to 20 sccm of $TiCl_4$ and from 500 to 3000 sccm of $NH_3$ into the deposition chamber while maintaining the chamber at a pressure within a range of from about 1 Torr to about 40 Torr and while maintaining the wafer at a temperature of from about 450° C. to about 650° C. until about 0.3 microns of titanium nitride have been deposited.

In accordance with the invention, wafer 10 is then removed from vacuum deposition chamber 26 and placed on a second wafer support 50 in an etch chamber 60, which may be a separate chamber or zone in the same vacuum apparatus. During the etch step, wafer 10 may be secured to second wafer support 50 either by gravity or by electrostatic clamping. The low pressure conventionally used during an etching process such as will be described below will, however, preclude the use of a vacuum to secure wafer 10 to second wafer support 50.

Figure 4:
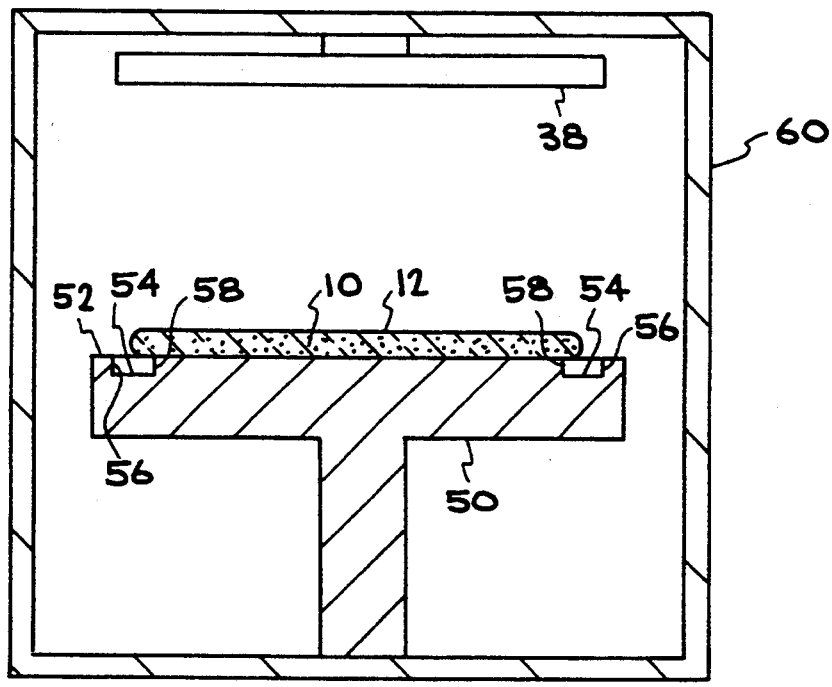
FIG. 4 is a vertical cross-sectional view of a wafer on a second wafer support having an annular groove formed coaxially thereon which permits removal of deposits from the end edge and backside of the wafer from the full deposition step.
Figure 5:
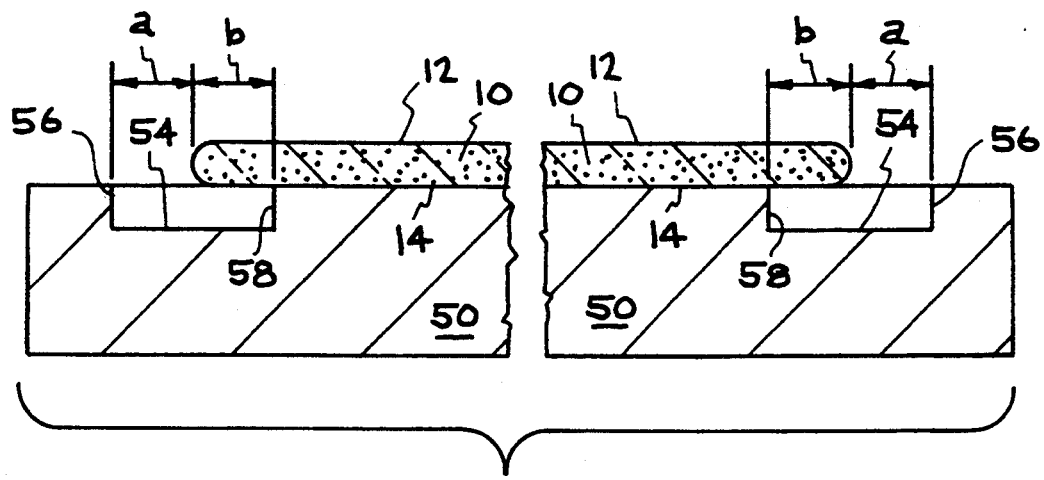
FIG. 5 is a fragmentary vertical side section view of an enlarged portion of FIG. 4 showing the dimensional relationship between the annular groove and the outer portions of a semiconductor wafer mounted coaxially on the second wafer support over the annular groove.
Figure 6:
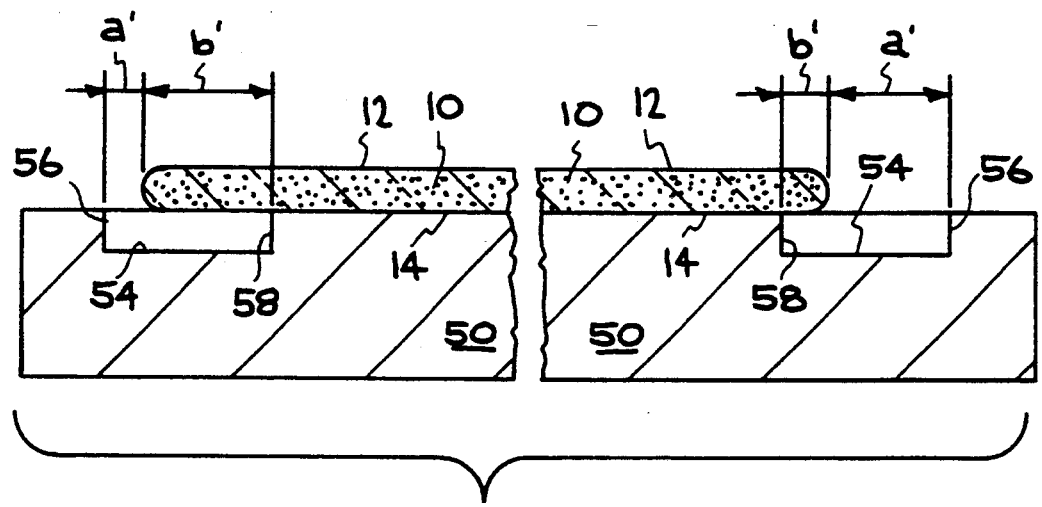
FIG. 6 is a fragmentary vertical side section view of an enlarged portion of FIG. 4 showing the dimensional relationship between the annular groove and the outer portions of a wafer mounted in misaligned form on the second wafer support over the annular groove.

Second wafer support 50, in the embodiment shown in FIGS. 4–6, is a generally circular support of larger diameter than wafer 10. As shown in the embodiment of FIGS. 4–6, wafer support 50 is provided with an annular groove 54 coaxially formed in surface 52 of support 50. Annular groove 54 is provided in surface 52 of support 50 to permit access by the etchant plasma to the rounded or beveled end edge portion of wafer 10, as well as a portion of the backside of wafer 10 to thereby provide for removal of any deposits thereon while the frontside surface 12 of wafer 10 is being etched to remove the deposition from the frontside surface of wafer 10. The depth of groove should be at least about 1 millimeter (mm), but may be deeper if desired.

To facilitate such end edge and backside deposition removal, groove 54 is provided with an outer wall 56 having a diameter of at least about 2 millimeters (mm) larger than the outer diameter of wafer 10. Preferably the outer diameter of groove 54 is at least about 4 mm larger than the outer diameter of wafer 10, to allow for possible misalignment of wafer 10 on second wafer support 50. Groove 54 is further provided with an inner wall 58 having a diameter which is at least about 4 mm smaller than the diameter of wafer 10 to thereby permit access by the etchant gas to the outermost 2 mm of the backside of wafer 10 (on all sides). This will provide an inner diameter for groove 54 which will be smaller than the outer diameter of that portion of the backside of said wafer not containing deposits thereon from said deposition step. Preferably the inner diameter of groove 54 is at least about 6 mm smaller than the diameter of wafer 10 to thereby also provide for the aforesaid possible misalignment of wafer 10 on wafer support 50, while still allowing access to about the outermost 2 mm of the backside of wafer 10.

As illustrated in FIGS. 5 and 6, when a 150 mm diameter wafer (6") is to be processed, for example, provision of groove 54 with an outer diameter of 154 mm will provide a gap "a" of 2 mm between the outer edge of wafer 10 and the outer wall 56 of groove 54 when wafer 10 is coaxially centered on wafer support 50, as shown in FIG. 5. Therefore, even if wafer 10 is misaligned by up to a millimeter on wafer support 50, as shown in FIG. 6, there will still be a gap "a'" ranging from about 1–3 mm between the end edge of wafer 10 and the outer wall 56 of groove 54, which will be ample to permit etchant gas to flow around the rounded or beveled end edge of wafer 10 to thereby contact the backside of wafer 10.

Referring again to FIGS. 5 and 6, it will be further seen (using the same example of a 150 mm wafer) that when the diameter of inner wall 58 of groove 54 in support 50 preferably does not exceed about 144 mm, i.e., is at least 6 mm smaller than the diameter of the wafer, coaxial alignment of wafer 10 on support 50 will leave the outermost circular sector width "b" of backside surface 14 exposed over groove 54, as shown in FIG. 5, an amount equal to 3 mm. Thus, even allowing for the aforesaid 1 mm misalignment of wafer 10 on support 50, as shown in FIG. 6, a dimension ranging from a minimum of 2 mm up to 4 mm will be provided for the width "b'" of the outermost circular sector of backside surface 14 of wafer 10 exposed by groove 54 to the etchant plasma. This should be more than adequate to remove all deposits on backside surface 14 of wafer 10, since such backside deposits rarely reach more than the outermost 1–2 mm of backside surface 14.

Figure 7:
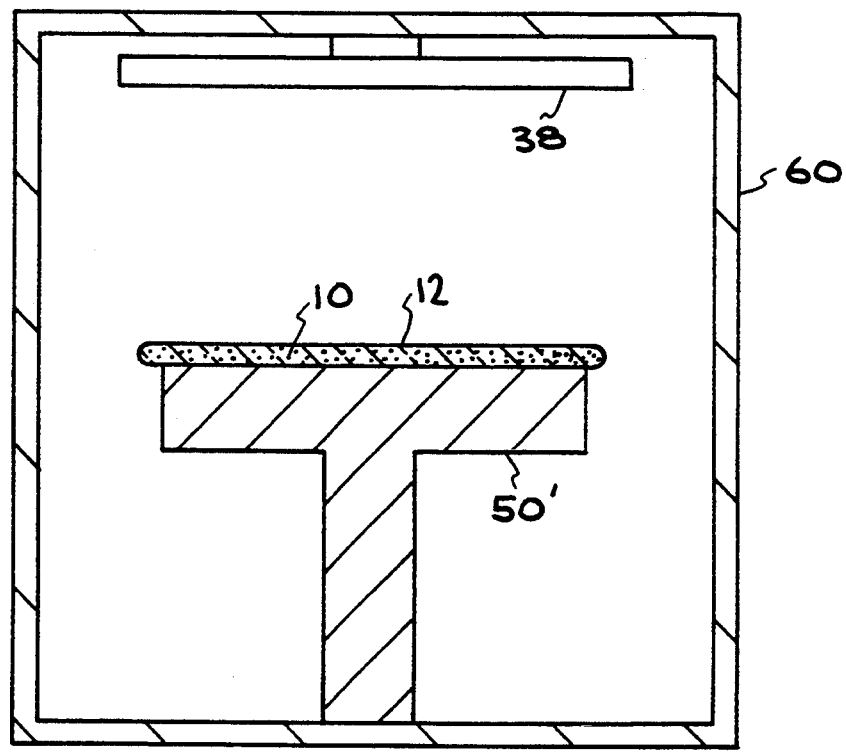
FIG. 7 is a vertical cross-sectional view of yet another embodiment of the second wafer support used in the process of the invention.

FIG. 7 shows an alternate embodiment of the second wafer support, denoted as 50', wherein instead of providing a groove 54, the diameter of wafer support 50' is at least about 4 mm smaller than the diameter of wafer to thereby permit access, by the etchant gas, to the outermost 2 mm of the backside of the wafer (on all sides) as in the previous embodiment. Preferably, the diameter of wafer support 50' is about 6 mm smaller than the diameter of wafer 10 to provide for possible misalignment of wafer 10 on wafer support 50', as previously described with respect to the embodiment of FIGS. 4–6.

Again using titanium nitride by way of example, the titanium nitride previously described as deposited on frontside surface 12 of wafer 10 may now be removed, for example, by flowing 10–50 sccm of $Cl_2$ and 20–100 sccm of Argon into the etch chamber while maintaining the chamber at a pressure of from about 0.02 Torr to about 0.2 Torr, while the wafer is maintained at a temperature of from about 25° C. to about 80° C. and igniting a plasma in the chamber at a power level of from about 100 to about 500 watts. The dimensions of groove 54 on wafer support 50, and the positioning of wafer 10 thereon will permit the plasma to contact the beveled or rounded end edge of wafer 10 as well as the outermost 1–2 mm of backside surface 14 of wafer 10 to thereby remove any titanium nitride which may have been deposited during the previous deposition step due to the lack of a shadow ring or other means which would normally inhibit deposition to the rounded or beveled end edge (as well as the outermost portions of the backside) of wafer 10.

Thus, the invention provides a process and apparatus which permits deposition of a material such as the illustrated titanium nitride across the entire front face of a semiconductor wafer while providing means for removal of any materials inadvertently deposited on the backside of the wafer during such a complete deposition on the frontside surface of the wafer.

Having thus described the invention what is claimed is:

1. A process for depositing a layer of material over the entire frontside surface of a semiconductor wafer without leaving residues on the backside of said wafer which comprises:
   a) depositing a layer of material on said entire frontside surface of said wafer;
   b) placing said wafer generally coaxially against a surface of a generally circular wafer support having means thereon for permitting access to at least the outermost portion of the backside of said wafer; and
   c) etching said wafer to remove from said backside of said wafer, said materials deposited thereon during said deposition step, by permitting etchant materials to contact said backside deposits through said access means on said wafer support.

2. The process of claim 1 wherein said step of placing said wafer against said wafer support having means thereon for providing access to the backside of said wafer comprise placing said wafer against a wafer support having an annular groove coaxially formed in said surface thereof facing said backside of said wafer, said groove having an outer diameter larger than the diameter of said wafer and an inner diameter smaller than the outer diameter of that portion of the backside of said wafer not containing deposits thereon from said deposition step.

3. The process of claim 2 wherein said annular groove has an outer diameter of at least about 2 mm greater than the diameter of said wafer and said step of placing said wafer coaxially against said surface of said wafer support facing said backside of said wafer further comprises providing a gap of at least about 1 mm between the outer edge of said wafer and the outer diameter of said annular groove whereby said etchant materials may pass through said gap to contact outer portions of the backside of said wafer.

4. The process of claim 3 wherein said annular groove has an inner diameter at least 4 mm smaller than the diameter of said wafer whereby at least the outer 2 mm of said backside surface of said wafer will be exposed to said groove to allow said etchant materials passing through said gap to contact said backside surface of said wafer to remove any deposits thereon from said deposition step.

5. The process of claim 3 wherein said outer diameter of said groove is at least 4 mm greater than said diameter of said wafer.

6. The process of claim 5 wherein said inner diameter of said groove is at least about 6 mm less than said diameter of said wafer.

7. The process of claim 3 wherein said annular groove has a depth of at least about 1 mm.

8. The process of claim 3 which includes the further steps of forming an insulating layer on said wafer and then forming one or more contact openings, vias, and/or trenches in said insulating layer prior to said deposition step whereby said layer of material will also deposit in said one or more contact openings, vias, and/or trenches as well as on the surface of said insulating layer.

9. The process of claim 8 wherein said etching step results in removal of said deposited material from said surface of said insulating layer, leaving said deposited material in said one or more contact openings, vias, and/or trenches.

10. The process of claim 9 wherein said deposited material is a conductive material.

11. The process of claim 9 wherein said deposited material is a conductive material selected from the group consisting of titanium, titanium nitride, tungsten, doped polysilicon, and aluminum.

12. The process of claim 1 wherein said step of placing said wafer against said wafer support having means thereon for providing access to the backside of said wafer comprise placing said wafer against a wafer support having an outer diameter which is smaller than that portion of said backside of said wafer not containing deposits from said deposition step.

13. The process of claim 12 wherein said step of placing said wafer against said wafer support further comprises placing said wafer against said wafer support having an outer diameter which is at least 4 mm smaller than the outer diameter of said wafer.

14. A process for depositing a layer of material over the entire front surface of a semiconductor wafer without leaving residues on the backside of said wafer, and end edge of said wafer, which comprises:
 a) securing a semiconductor wafer against a surface of a first wafer support without contacting the frontside surface of said wafer to thereby permit access by deposition materials to the entire frontside surface of said wafer;
 b) depositing a layer of material on said entire frontside surface of said semiconductor wafer;
 c) placing said wafer generally coaxially on a surface of a generally circular second wafer support having an annular groove coaxially formed in said surface thereof facing said backside of said wafer, said annular groove having an outer diameter at least about 2 mm larger than the diameter of said wafer to thereby provide a gap between the outer edge of said wafer and the outer diameter of said groove, said groove further having an inner diameter at least 4 mm smaller than the diameter of said wafer to thereby expose that portion of said backside of said wafer containing deposits thereon from said deposition step; and
 d) etching said wafer to remove from said backside of said wafer, and said end edge of said wafer, said material deposited thereon during said deposition step, by permitting etchant materials to pass through said gap into said annular groove to thereby contact said backside deposits on said wafer.

15. The process of claim 14 wherein said outer diameter of said groove is at least 4 mm greater than said diameter of said wafer.

16. The process of claim 15 wherein said inner diameter of said groove is at least about 6 mm less than said diameter of said wafer.

17. The process of claim 14 wherein said annular groove has a depth of at least about 1 min.

18. The process of claim 15 which includes the further steps of forming an insulating layer on said wafer and then forming one or more contact openings, vias, and/or trenches in said insulating layer prior to said deposition step whereby said layer of material will also deposit in said one or more contact openings or vias as well as on the surface of said insulating layer.

19. The process of claim 18 wherein said etching step results in removal of said deposited material from said surface of said insulating layer, leaving said deposited material in said one or more contact openings, vias, and/or trenches.

20. The process of claim 18 wherein said deposited material is a conductive material selected from the group consisting of titanium, titanium nitride, aluminum, doped polysilicon, and tungsten.

21. A wafer support for a semiconductor wafer etching process which permits removal of materials deposited on the backside of said wafer during a previous deposition step which comprises:
 a) a generally circular member having a flat surface thereon to receive said wafer; and
 b) an annular groove coaxially formed in said flat surface, said groove having an outer diameter larger than the diameter of said wafer and an inner diameter smaller than the outer diameter of that portion of the backside of said wafer not containing deposits thereon from said previous deposition step.

22. The wafer support of claim 21 wherein said annular groove has an outer diameter of at least about 2 mm greater than the diameter of said wafer to thereby provide a gap between the outer edge of said wafer and the outer diameter of said groove to thereby permit etchant materials to flow through said gap into said groove to thereby contact and remove material deposited on said backside of said wafer.

23. The wafer support of claim 22 wherein said annular groove has an inner diameter at least 4 mm smaller than the diameter of said wafer whereby at least the outer 2 mm of said backside surface of said wafer will be exposed to said groove to allow etchant materials passing through said gap to contact said backside surface of said wafer to remove said deposits thereon.

24. The wafer support of claim 22 wherein said outer diameter of said groove is at least 4 mm greater than said diameter of said wafer.

25. The wafer support of claim 24 wherein said inner diameter of said groove is at least about 6 mm less than said diameter of said wafer.

26. The wafer support of claim 21 wherein said annular groove has a depth of at least about 1 min.

* * * * *